Nov. 18, 1969 G. A. VAN DINE 3,479,529

SEMICONDUCTOR MULTIVIBRATOR

Filed Dec. 27, 1965

INVENTOR
BY G. A. VAN DINE

Charles Scott Phelan

ATTORNEY

United States Patent Office 3,479,529

Patented Nov. 18, 1969

3,479,529

SEMICONDUCTOR MULTIVIBRATOR

Gilbert A. van Dine, Middletown, N.J., assignor to Bell Telephone Laboratories, Incorporated, New York, N.Y., a corporation of New York Filed Dec. 27, 1965, Ser. No. 516,359
Int. Cl. H03k *3/284*
U.S. Cl. 307—273 8 Claims

ABSTRACT OF THE DISCLOSURE

There is described a fast recovery monostable multivibrator circuit which includes two transistors and which produces output pulses having a constant pulse width regardless of power supply voltage variation and short input pulse width. When the circuit is triggered into its output state, a limiter arrangement terminates charging of a timing capacitor at the end of a predetermined exact time period. The timing capacitor discharges fast through a low impedance provided by a conducting one of the transistors.

Figure 1:
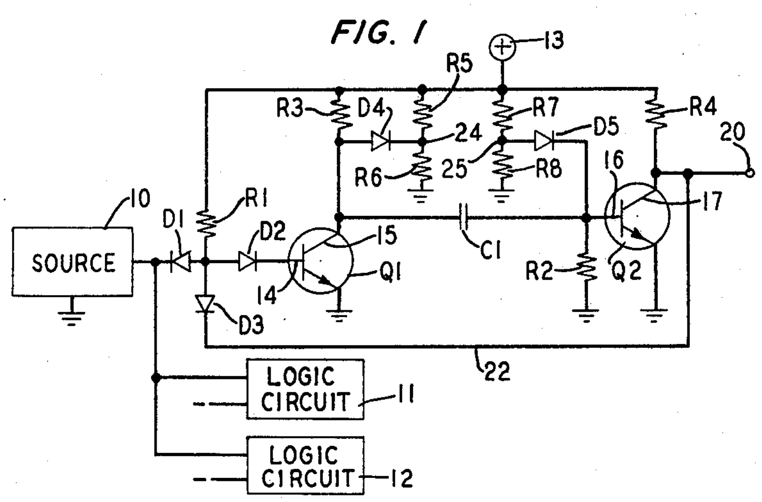

This invention is a transistor switching circuit more particularly described as a pulse-width-compensated fast-recovery monostable multivibrator.

Conventional monostable multivibrator circuits comprise two common-emitter connected transistors cross-coupled so that the circuit has a stable state and a temporarily-stable state, or unstable state. The circuit normally rests in the stable state, and changes to the temporarily-stable state, hereinafter referred to as the output state, for a predetermined period of time in response to an input trigger signal. A conventional multivibrator can be arranged to compensate for supply voltage fluctuations thereby maintaining a fixed time duration for the output state by using biasing resistors of large value. Recovery time of a conventional monostable multivibrator usually is a substantial time compared with the time duration of each output state because the recovery path includes one of the large value biasing resistors. Methods have been devised to reduce recovery time so that a monostable multivibrator can be operated at an increased pulse repetition rate, however, the methods used in the prior art require the use of additional circuit components which increase the cost of installation and maintenance.

It is well known that simpler forms of conventional monostable multivibrators usually have an input impedance which is very different from the input impedance of logic circuits often used in data processing systems. In the design of data processing systems it is desirable to use logic devices all having similar input impedances to avoid excessive consideration of problems caused by circuit loading of a driving source. One particular type of logic circuit, used in data processing systems, employs a negative input signal diode OR gate having its output coupled to the base input electrode of a transistor. Because it is desirable to have similar input impedance for all logic circuits, a multivibrator used in conjunction with the particular logic circuits should have the same input impedance as they have. It has been a practice to arrange a conventional monostable multivibrator circuit so that its input impedance is the same as the particular logic circuit input, however, the methods employed in the prior art require the utilization of additional circuit components which increase the cost of installation and maintenance.

Therefore it is an object of this invention to provide a pulse-width-compensated fast-recovery monostable multivibrator which operates with an unregulated power supply without requiring the most of additional circuit components.

It is also an object of this invention to provide a pulse-width-compensated fast-recovery monostable multivibrator which has a desirable input impedance without requiring the cost of additional circuit components.

It is a further object of this invention to combine accurate output pulse timing and fast recovery time in a two-transistor monostable multivibrator utilizing an unregulated power supply in a data processing system.

These and other objects of the invention are realized in an illustrative embodiment thereof which is a fast-recovery monostable multivibrator circuit which produces output pulses having a constant pulse width regardless of variations of supply voltage. The input of the circuit is through a negative polarity input signal diode OR gate which has one of its input terminals connected to a trigger source and another input terminal included in one of the cross-coupled feedback paths of the multivibrator circuit. When the circuit is triggered into its output state, a timing capacitor is charged toward the supply voltage until the magnitude of charge accumulated in the capacitor reaches a fixed proportion of the variable supply voltage and operates a limiter circuit. The duration of the charge time, and therefore the output state time, is a fixed interval which is independent of variation of the supply voltage. Termination of the charging of the timing capacitor initiates a transition of the circuit from the output state to its stable state. During an interval in which the multivibrator circuit is in the stable state one of the transistors is conducting. Recovery of the multivibrator circuit from the output state to the stable state is fast because the timing capacitor discharges through a low impedance path including the conducting one of the two transistors.

A feature of the invention is the utilization of a diode and a voltage divider as a limiter which operates in response to a charge on a timing capacitor reaching a fixed proportion of the potential of a power supply so that the charging time of the capacitor is substantially fixed regardless of appreciable potential fluctuations of the power supply, thereby biasing the pulse width of output pulses from a monostable multivibrator at a substantially constant value.

Another feature is the fast discharge of a timing capacitor in a two-transistor monostable multivibrator circuit through a conducting one of the two transistors.

A further feature is an OR gate having one input included in one of the cross-coupled feedback paths of a monostable multivibrator so that another input of the gate has an impedance similar to the input impedance of particular logic circuits.

A better understanding of the invention may be derived from the detailed description following if that description is considered with respect to the attached drawings in which:

FIG. 1 is a schematic diagram of a semiconductor monostable multivibrator circuit in accordance with the features of the invention;

FIGS. 2, 3, 4, and 5 are key waveforms which represent operating conditions of the embodiment of FIG. 1 at various circuit locations during transmission of a series of input signals.

Figure 2:
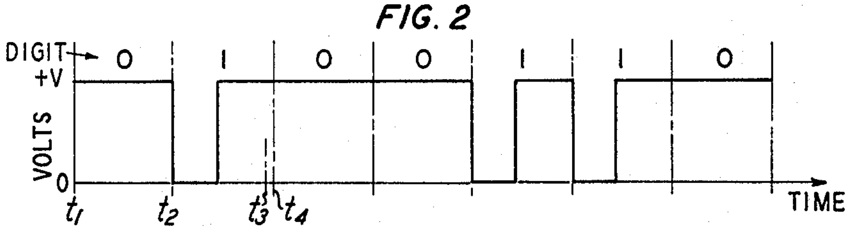

Referring now to FIG. 1, there is shown a source 10 which produces signals representing the binary digits ONE and ZERO that are usually called bits. In FIG. 2 there is shown for purposes of illustration a sequence of binary digits that commences in point of time with the leftmost digit and terminates with the rightmost digit. The source 10 produces output signals representative of the same sequence of binary digits by a waveform also shown in FIG. 2. Each digit of the sequence is represented by that part of the waveform (FIG. 2) existing during a fixed interval, or bit period, such as between the times $t_1$ and $t_2$. In FIG. 2 the signal waveform is a constant predetermined positive potential all of the time except when a ONE is generated. When a ONE is generated, the signal potential from the output of the source 10 makes a negative-going transition to a near zero potential. The signal potential remains at a near zero potential for a period of time less than the duration of an output pulse from the circuit of this invention. The bit period is equal to the duration of an output pulse plus a short recovery time.

In FIG. 1, the signals produced by the source 10 are applied to the cathode of a diode D1 in the input section of a monostable multivibrator circuit and to separate input terminals of logic circuits 11 and 12 in a particular data processing system. The anode of the diode D1 is connected to the anode of a diode D2 and to the anode of a diode D3. The cathodes of the diodes D1 and D3 are input terminals arranged to be similar to those of negative polarity input signal diode OR gate which is employed in the particular data processing system. In such a gate, a ground potential is produced at the common junction between diodes D1 and D3 when a ground potential is applied to either the cathode of the diode D1 or to the cathode of the diode D3, and a positive potential is produced at the common junction when a positive potential is applied to both cathodes. The anodes of the three diodes, D1, D2, and D3, are coupled by way of a resistor R1 to a positive potential terminal 13 of a grounded direct-current power supply. A potential $V_{13}$ of the terminal 13 is not regulated and therefore is variable within appreciably wide predetermined limits. The cathode of the diode D2 is connected to a base electrode 14 of an NPN transistor Q1. The diodes D1, D2, and D3, together with the resistor R1 and the transistor Q1, are arranged in a configuration that is similar to the configuration of the particular type of logic switches 11 and 12 which may be AND logic, OR logic, or other conventional logic circuits. The input impedance through the diode D1 to the transistor Q1 is equivalent to the input impedance of the logic switches 11 and 12.

The transistor Q1 is connected in a grounded-emitter configuration and has a collector electrode 15 coupled by means of a capacitor C1 to a base electrode 16 of an NPN transistor Q2. The transistor Q2 is also connected in a grounded-emitter configuration and has a collector electrode 17 which is connected to an output terminal 20 of the multivibrator circuit. The base electrode 16 is coupled by way of a resistor R2 to a source of reference potential, shown illustratively as ground. The cathode of the diode D3 is connected by means of a lead 22 to the collector electrode 17 completing a feedback path that cross-couples the output terminal 20 through the diodes D3 and D2 to the base electrode 14. The collector electrodes 15 and 17 are coupled respectively by a resistor R3 and a resistor R4 to the terminal 13.

The multivibrator circuit operates in a stable state when the source 10 produces a constant positive potential signal, shown in FIG. 2, commencing at the beginning of a bit period such as at times $t_1$ and $t_4$. The positive potential signal, starting at time $t_1$ and lasting until the time $t_2$, back biases the diode D1 so that the diode D1 is cut off. The signal from the source 10 encounters an open circuit impedance at the diode D1, and a positive potential from the terminal 13 is applied by way of the diode D2 to the base electrode 14 of the transistor Q1. The transistor Q1 is thereby biased to conduct in the saturated portion of its dynamic characteristic curve from the time $t_1$ to the time $t_2$.

Figure 3:
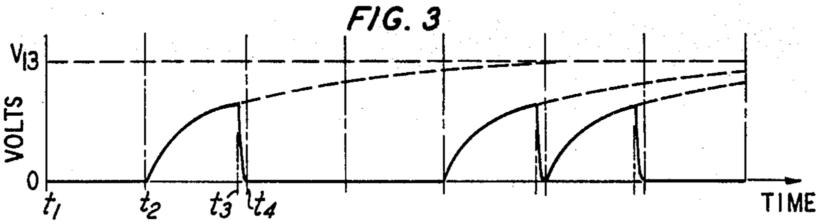
Figure 4:
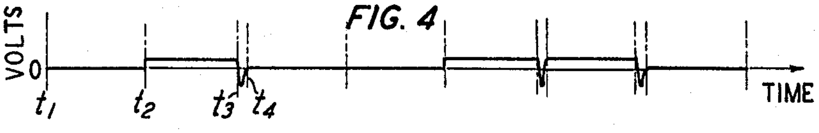
Figure 5:
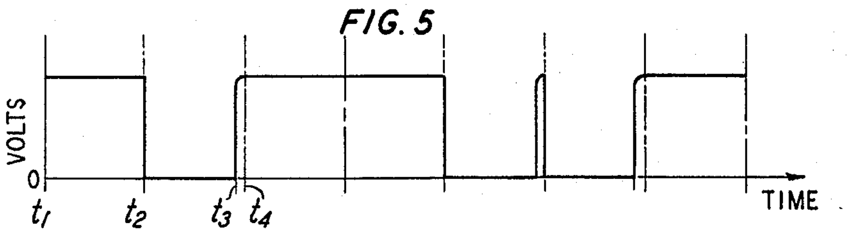

An output signal waveform for the transistor Q1 is taken from the collector electrode 15 and is shown in the FIG. 3. The time designations, used in FIG. 3 and subsequently in FIGS. 4 and 5, represent the same times as the times represented by similar designations used in FIG. 2. In FIG. 3 the potential on the collector electrode 15 is ground potential starting at the time $t_1$ and lasting until the time $t_2$ while the transistor Q1 is conducting. The waveform of the signal on the collector electrode 15 is translated by the capacitor C1 and is applied to the base electrode 16 where it produces a voltage represented by the waveform shown in FIG. 4. There is shown, in FIG. 5, an output signal waveform produced on the collector electrode 17 and on the output terminal 20. As shown in FIG. 4 between the time $t_1$ and the time $t_2$, the base electrode 16 is at ground potential which cuts off the transistor Q2 that then produces a positive potential on its collector electrode 17.

As shown in FIG. 2, a ONE from the source 10 is initiated when a negative-going transition from the positive potential to a near zero potential produces sufficient forward bias on the diode D1 to make the diode conduct and apply a substantially zero potential to the anode of the diode D2 which is thereby cut off. The diode D2 is selected to prevent input signal transitions of smaller value than a predetermined threshold from being transmitted to the base electrode 14. When the diode D2 is cut off the transistor Q1 has no input to its base and therefore the transistor is also cut off. When the transistor Q1 is being cut off, the multivibrator circuit makes a transition from the stable state to its output state. The diode D2 has a storage charge large enough so that it reduces the turn-off time of the transistor Q1 by providing a low impedance path to carry off reverse base current from the transistor Q1 while the multivibrator circuit is making the transition.

As soon as the transistor Q1 is cut off at the time $t_2$, the potential on the collector electrode 15 rises exponentially, as shown in FIG. 3, toward the potential $V_{13}$ of the terminal 13 as the capacitor C1 is charged by a current through the resistor R3. The current charging the capacitor C1 flows to ground through the resistor R2 and the base electrode 16 of transistor Q2 producing a small positive potential on the base electrode, as shown in FIG. 4 between the times $t_2$ and $t_3$. This current through the base electrode 16 is sufficient to bias the transistor Q2 into conduction in the saturated portion of its dynamic characteristic curve. The base current to the transistor Q2 is supplied by the current charging the capacitor C1 as long as that capacitor continues to be charged. The resistor R2 is as small as possible to provide a fast discharge path for storage charge accumulated in the transistor Q2 during each output state without reducing base drive current for the transistor Q2 below the value necessary to insure that the transistor Q2 operates in saturation when it conducts. While the transistor Q2 is conducting between the times $t_2$ and $t_3$ the potential on its collector electrode 17 and on the output terminal 20 becomes substantially ground potential, as shown in FIG. 5. Now the transistor Q1 is cut off, the transistor Q2 is conducting, and the multivibrator circuit is in its output state.

The diode D3 clamps the potential on the anodes of the diodes D1, D2, and D3 to the ground potential of the collector electrode 17 as long as the transistor Q2 is conducting and thereby prevents a positive potential from being applied to the base electrode 14 during the output state of the multivibrator circuit. The circuit remains in the output state until the potential on the collector electrode 15 becomes sufficient to cause a limiter circuit to conduct and thereby terminate the charging of the capacitor C1.

In the limiter circuit a resistor R5 and a resistor R6 form a voltage divider between the terminal 13 and ground. A common junction between the resistors R5 and R6 is a terminal 24 which has a reference potential $V_{24}$ varying directly in proportion to the potential $V_{13}$ on the terminal 13. A diode D4 is coupled between the collector electrode 15 and the terminal 24 to clamp the potential at the collector electrode 15 to the reference potential $V_{24}$. When the transistor Q1 is cut off and the potential on the collector electrode 15 rises exponentially as the capacitor C1 is charged, the rise of potential is terminated as soon as the collector potential is substantially the same as the reference potential $V_{24}$ and the diode D4 is thereby biased to conduct. The resistors R5 and R6 are chosen to have a low resistance compared to the resistor R3 so that the reference potential $V_{24}$ does not vary appreciably when the diode D4 conducts.

Because the potential $V_{24}$ is a direct proportion of the potential on terminal 13, and because the potential on the collector electrode 15 is rising toward the potential on terminal 13, the time at which the collector electrode 15 reaches the reference potential $V_{24}$ is independent of the variations of the potential $V_{13}$ on the terminal 13. The independence of the time at which the collector electrode 15 reaches the reference potential may be better understood in reference to the well-known equation $$e=V_{13}\left(1-\epsilon^{\frac{-t}{RC}}\right)$$

where $e$ is the instantaneous potential on a capacitor C being charged in a series RC circuit from an initially zero potential toward the potential $V_{13}$, and $\epsilon$ is the base of natural logarithms. For the embodiment of FIG. 1, $e$ is the potential on the collector electrode 15. As the value of $e$ rises, the diode D4 conducts at a value of $e$ approximately equal to the potential $V_{24}$. The supply potential $V_{13}$ and the reference potential $V_{24}$ are large enough so that junction potentials in the transistors Q1 and Q2 and the diode D4 are substantially negligible. The values of $V_{24}$ and $V_{13}$ have a constant proportionality K in the circuit of this invention. It follows then that at the instant the diode D4 begins to conduct $$\frac{V_{24}}{V_{13}}=K=\left(1-\epsilon^{\frac{-t}{RC}}\right)$$

and the time $t$ necessary to charge the capacitor to the potential $V_{24}$ is independent of the potential $V_{13}$. Therefore, the potential $V_{13}$ may vary appreciably plus or minus from its selected potential without substantially altering the time at which the collector electrode 15 reaches the potential at which the diode D4 conducts.

When the diode D4 conducts, the current which has been charging the capacitor C1 is shunted so that it bypasses the capacitor C1 and thus terminates the base current to the transistor Q2. As soon as the base current to the transistor Q2 ceases, that transistor is cut off, and the waveform on its base electrode 16 makes a negative-going swing (FIG. 4). When the transistor Q2 is cut off as shown at time $t_3$ (FIG. 5), the potential rises on the collector electrode 17 and on the output terminal 20 to a positive value. This positive potential back biases the diode D3. Because diode D1 is also back biased at the time $t_3$, the combination of the potential source 13 and the resistor R1 apply a current to the base electrode 14 by way of the diode D2. The transistor Q1 conducts and produces a low impedance between its collector electrode 15 and ground. This low impedance to ground causes the potential on the collector electrode 15 to swing rapidly to a near-ground potential (FIG. 3) between times $t_3$ and $t_4$. This potential swing is coupled via capacitor C1 to the base electrode 16 of the transistor Q2 and to the cathode of a diode D5, causing the diode D5 to conduct.

A resistor R7 and a resistor R8 are connected in a series circuit to form a voltage divider between the terminal 13 and ground. A terminal 25 at the junction between the resistors R7 and R8 is coupled by way of the diode D5 to the base electrode 16. The resistors R7 and R8 and the diode D5 are selected so that the diode D5 is biased on the verge of conduction when the circuit is in its stable state. The diode D5 is on the verge of conduction when it is biased so that a slight decrease of the potential on its cathode will cause the diode to conduct. The resistance of the resistor R8 is also a small value compared to the resistance of the resistor R3 to reduce recovery time in accordance with the subsequent discussion.

As soon as the transistor Q1 is turned on, the capacitor C1 commences to discharge in a path through the collector and emitter electrodes of the transistor Q1 in a series connection with two branch circuits. A first branch circuit including the resistor R8 and the diode D5 conducts a majority of the current discharged. A second branch circuit including the resistor R2 conducts a portion of the current discharged. Thus a low impedance path including the low value resistor R8, the forward biased diode D5, and the collector to emitter circuit of the conducting transistor Q1 is produced for discharging the capacitor C1 rapidly.

For the embodiment of this invention, recovery time is the interval of time required to discharge the potential stored on the capacitor C1 to a substantially zero potential. Once the capacitor C1 is discharged the multivibrator can be triggered during a next bit period while the initial conditions of the circuit are identical to the initial conditions of the circuit for the present period. The magnitude of recovery time is dependent upon an RC time constant of the discharge path. Because the impedance of the discharge path is a very small resistance value compared with the resistance of the resistor R3, the multivibrator circuit has a recovery time much faster than the fixed interval of the output state. In the waveforms of FIGS. 3, 4, and 5, the recovery of the circuit is shown as a transient response just prior to the time $t_4$. After the recovery is complete and the charge on the capacitor is stable, a new signal can trigger the circuit back to its output state.

Thus there has been described a fast recovery two-transistor monostable multivibrator circuit which produces an output signal having a predetermined output pulse width regardless of potential fluctuations from the direct-current supply. The input impedance of this multivibrator is similar to the input impedance of particular logic circuits because one input to an input OR gate is included in a feedback path of the multivibrator.

The above-detailed description is by way of illustration of one embodiment of the invention and it is understood that other embodiments thereof will be obvious to those skilled in the art. These additional embodiments are considered to be within the scope of the invention.

What is claimed is:

1. In combination a source of signals, first and second transistors each comprising a base and a collector, means biasing said first transistor into conduction, means coupling said source to said base of said first transistor for turning off said first transistor in response to each of said signals, capacitive means coupling said collector of said first transistor to said base of said second transistor, means coupled to said collector of said first transistor for charging said capacitive means to a potential in response to turn-off of said first transistor, said second transistor producing an output signal on said collector of said second transistor in response to charging of said capacitor, means coupled to said collector of said first transistor for disabling said charging means in response to a predetermined time period elapsing after turn-off of said first transistor, and said second transistor terminating said output signal in response to disabling of said charging means.

2. A combination in accordance with claim 1 comprising means coupling said collector of said second transistor to said base of said first transistor so that either said signals from said source or said output signal hold said first transistor turned off.

3. A combination in accordance with claim 1 in which said first and second transistors are connected in grounded-emitter configurations, said charging means comprises a direct-current supply with variable output potential, said disabling means includes means to limit charge on said capacitor to a predetermined proportion of said supply potential, and said combination comprises means discharging said capacitive means through said first transistor in response to turn-on of said first transistor upon termination of said output signal.

4. A combination in accordance with claim 3 in which said discharging means discharges said capacitive means much more rapidly than said charging means charges said capacitive means.

5. A combination in accordance with claim 3 in which said charging means comprises a first resistor coupling said supply to said collector of said first transistor, a first diode couples said collector of said second transistor to said coupling means, first and second voltage dividers couple said supply to ground and each comprises an intermediate terminal, a second diode couples said collector of said first transistor to said terminal of said first voltage divider, a third diode couples said terminal of said second voltage divider to said base of said second transistor, and a second resistor couples said base of said second transistor to ground.

6. A combination in accordance with claim 5 in which said first voltage divider is comprised of resistors having resistance small enough relative to said first resistor that a potential on said terminal of said first voltage divider is substantially unchanged by a current conducted through said first diode.

7. A combination in accordance with claim 5 in which said second voltage divider comprises a third resistor having a resistance small relative to said first resistor coupling said terminal of said second voltage divider to ground, and said terminal of said second voltage divider having a potential when said second transistor is not conducting nearly sufficient to cause said third diode to conduct.

8. In a monostable multivibrator circuit having stable and output states of operation first and second transistors, means cross-coupling a collector of said first transistor to a base of the second transistor so that said first transistor is conducting during times of said stable state of operation of said multivibrator, an OR gate having at least first and second inputs and an output, a signal source coupled to said first input, means coupling an output of said second transistor to said second input, means coupling the output of the OR gate to an input of the first transistor, a source of operating voltage subject to output voltage fluctuations coupled to said first and second transistors, an electrically chargeable time constant circuit coupled to said source, means coupled to said source for limiting the magnitude of charge accumulated in said time constant circuit as a function of a predetermined proportion of said operating voltage of said source so that the duration of said output state is independent of said voltage fluctuations, and means connecting said time constant circuit to said first transistor for discharging said time constant circuit through said first transistor.

References Cited

UNITED STATES PATENTS

| | | | |
|---|---|---|---|
| 2,946,899 | 7/1960 | Day | 307—265 XR |
| 3,080,489 | 3/1963 | White | 307—294 XR |
| 3,143,667 | 8/1964 | Smithson | 307—273 |
| 3,270,215 | 8/1966 | Mellott et al. | 307—273 |
| 3,374,365 | 3/1968 | Lyles et al. | 307—273 |

DONALD D. FORRER, Primary Examiner

S. T. KRAWCZEWICZ, Assistant Examiner

U.S. Cl. X.R.

307—265, 294 296